(12) United States Patent
Ikeuchi

(10) Patent No.: US 6,677,600 B2
(45) Date of Patent: Jan. 13, 2004

(54) EUV RADIATION SOURCE

(75) Inventor: Mitsuru Ikeuchi, Hyogo (JP)

(73) Assignee: Ushio Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/397,526

(22) Filed: Mar. 27, 2003

(65) Prior Publication Data
US 2003/0183787 A1 Oct. 2, 2003

(30) Foreign Application Priority Data
Mar. 27, 2002 (JP) ........................... 2002-087925

(51) Int. Cl.[7] ................................................. G21G 4/00
(52) U.S. Cl. ............................... 250/504 R; 250/493.1
(58) Field of Search .......................... 250/504 R, 493.1

(56) References Cited

U.S. PATENT DOCUMENTS

| | | |
|---|---|---|
| 5,521,031 A | 5/1996 | Tennant et al. |
| 5,963,616 A | 10/1999 | Silfvast et al. |
| 6,002,744 A | 12/1999 | Hertz et al. |
| 6,031,241 A | 2/2000 | Silfvast et al. |
| 6,064,072 A | 5/2000 | Partlo et al. |
| 6,188,076 B1 | 2/2001 | Silfvast et al. |
| 6,243,206 B1 | 6/2001 | Wangler |
| 6,356,618 B1 | 3/2002 | Fornaciari et al. |
| 6,576,917 B1 * | 6/2003 | Silfvast .................. 250/504 R |

FOREIGN PATENT DOCUMENTS

JP 09-115813 A1 5/1997

* cited by examiner

Primary Examiner—Kiet T. Nguyen
(74) Attorney, Agent, or Firm—Rader, Fishman & Grauer PLLC (57) ABSTRACT

An EUV radiation source comprises a first electrode having a first through hole, a second electrode having a second through hole, a movable insulator, having a plurality of third through holes, provided between the first and second electrodes, wherein actuating gas is introduced in the first, second through holes and one of the plurality of third through holes, and voltage is impressed between the first and second electrodes when the first, second and plural through holes are located on a common axis.

11 Claims, 7 Drawing Sheets

EUV RADIATION SOURCE

TECHNICAL FIELD OF THE INVENTION

This invention relates to an EUV (Extreme Ultraviolet) radiation source used for a light source of a semiconductor exposure apparatus etc.

DESCRIPTION OF RELATED ART

A reduction exposure apparatus is used to manufacture a semiconductor circuit having fine patterns. Conventionally, an X-ray reduction exposure apparatus is used therefor. For example, in Japanese Laid Open Patent No. 9-115813, an exposure apparatus in which an X-ray generating apparatus is use is disclosed.

In the exposure apparatus, an X-ray source, an illumination optical system, a mask, and wafer etc. as a whole are contained a vacuum container that is kept vacuous. An X-ray from the X-ray source is irradiated on a mask on which a circuit pattern is formed and the image of the mask is reduced and projected on the wafer, so that resist disposed on the wafer surface is exposed and the circuit pattern is transferred.

In recent years, as a semiconductor integrated circuit becomes smaller and smaller, shorter wave length light is required. As a short wave length light source, a KrF laser source (248 nm) and an ArF laser source (193 nm) have been developed. A 50 nm EUV lithograph that is so-called the last lithography of a Si device is being developed.

A light source for the EUV lithography irradiates EUV radiation whose wavelength is about 10 to 13 nm. Discharge plasma is used to irradiate an EUV radiation having an about 10 to 13 nm wavelength.

In Japanese Laid Open Patent No. 2001-42098, a plasma focus type EUV radiation source is disclosed. Further, in U.S. Pat. No. 6,188,076, and WO 01/97575 specification, an EUV radiation source in which a capillary discharge is used is disclosed. All of the EUV radiation generating apparatuses described above, generate EUV radiation by generating high temperature and high density plasma by discharge.

Figure 6:
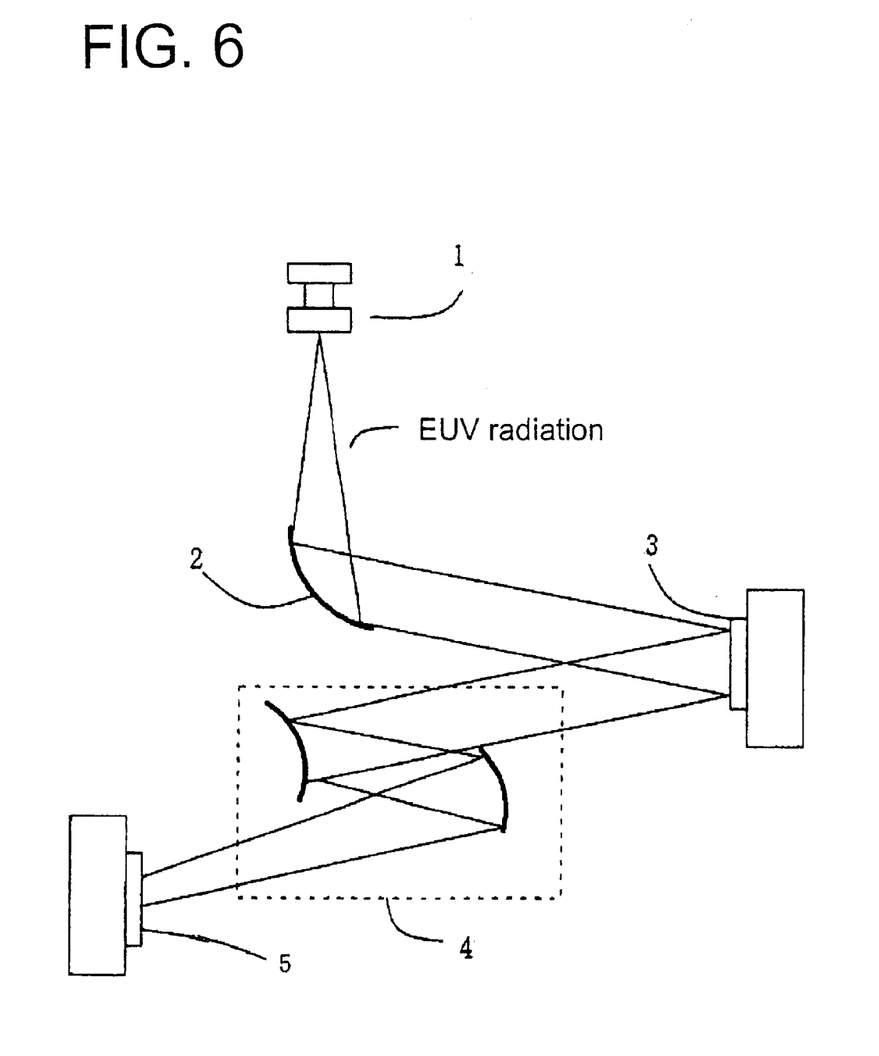
FIG. 6 is a schematic view of a semiconductor exposure apparatus in which an EUV radiation source is used.

As shown in FIG. 6 (a schematic diagram), in a semiconductor exposure apparatus in which an EUV radiation source is used, the EUV radiation source 1 in which capillary discharge is used, a light condensing mirror 2 having multi-layer films on a reflecting surface thereof, a reflecting type mask 3, a projection optical system 4, wafer 5 etc. are contained in a vacuum container. EUV radiation is condensed by the condensing mirror 2 and then is emitted to the reflecting type mask 3. The reflected light from the reflecting type mask 3 is reduced and projected on the surface of the wafer 5 via the projection optical system 4.

Figure 7:
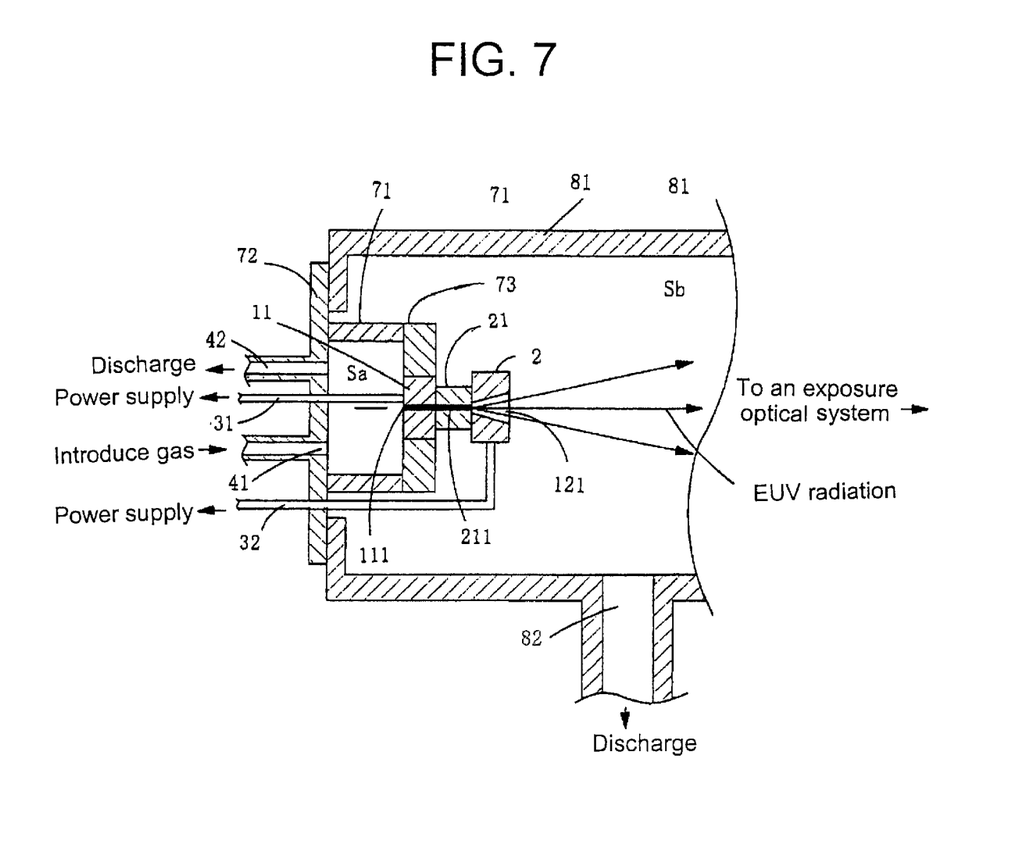
FIG. 7 is a diagram showing a structural example of conventional EUV radiation source in which capillary discharge is used.

FIG. 7 shows an example of conventional EUV radiation source in which capillary discharge described above is used and is a cross sectional view taken along a plan containing the optical axis of the EUV radiation irradiated from the EUV radiation source.

As shown in FIG. 7, the capillary structure 21 is disposed, for example, between a first electrode 11 (a high voltage side electrode) made of tungsten and a second electrode 12 (a ground side electrode) made of tungsten. The capillary structure 21 is an insulated cylinder made of, for example, silicon nitride. The capillary structure 21 has a 3 mm diameter capillary 21 at the center of the capillary structure 211.

The first and second electrodes 11 and 12 are electrically connected to a power supply (not shown) via leads 31 and 32, and high voltage pulse is applied between the first and second electrodes 11 and 12 from the power source. The second electrode is usually grounded, and for example negative high voltage pulse is applied to the first electrode 11. (Hereinafter refer to the first electrode and the second electrode as a high voltage side electrode and a ground side electrode, respectively.)

The high voltage side electrode 11 has a through hole 111 and the ground side electrode 12 has a through hole 121. These through holes and the capillary 211 of the capillary structure 21 are on the same axis.

An insulated plate 73 is provided on the ground side electrode 11. The insulated plate 73 is fixed on a partitioning cylinder 71 and further the partitioning cylinder 71 is fixed on a bottom plate 72. Thus, a closed space Sa is defined by the high voltage side electrode 11, the insulated plate 73, the partitioning cylinder 71 and the bottom plate 72.

On the bottom plate 72, through holes in which the leads 31 and 32 are provided, a gas introducing inlet 41 15 for introducing gas into the space Sa, an exhaust port 42 are provided. Actuating gas, for example xenon, is introduced from the gas introducing inlet 41 and discharged from the exhaust port 42 so that pressure in the closed space Sa is controlled so as to be appropriate.

The bottom plate 72 and an outside cylinder 81 are air-tightly joined and define a space Sb isolated from the outside. An exhaust port 82 is provided on the outside cylinder 81.

The actuating gas in the closed space Sa flows out to the space Sb via the through holes 111 and 121 formed in the electrodes 11 and 12 and the capillary 211, and then it is discharged from the exhaust port 82. The inside of the isolated space Sb is maintained in a vacuum condition by increasing displacement from the exhaust port 82.

In FIG. 7, when a high voltage pulse is applied to the ground side electrode 12 and the high voltage side electrode 11 while the actuating gas is introduced to the though holes 111 and 121 and the capillary 211, gas discharge takes place inside the capillary 211, and high temperature plasma is formed. Thereby, EUV radiation having 10 to 13 nm wavelength is generated. The EUV radiation is irradiated into the space Sb kept in a vacuum condition.

As described above, the EUV radiation source generates EUV radiation by gas discharge generated by impressing high voltage pulse. When electric input energy is 10 J per pulse and 1,000 pulses are impressed, the total energy is 10,000 W.

That is, to increase power of light emitted from the EUV radiation source, the electric input energy per one pulse should be increased or the number of impressed pulses per unit time should be increased. The larger the power of the EUV radiation irradiated from the EUV radiation source is, the more advantageous it is for the throughput of an exposure process to be improved.

As described above, to increase the power of the EUV radiation irradiated from the EUV radiation source, the electric input energy per one pulse or the number of pulses applied per unit time must be increased. In either way, the increase of power of the light emitted from the EUV radiation source raises temperature of the EUV radiation source comprising the high voltage side electrode 11, the ground side electrode 12 and the capillary 21. As a result, toxic dust (hereinafter referred to as debris) is generated since the temperature of the capillary structure 21 opposed to the center of the discharge plasma where the temperature increases most, increases, and the surface of the capillary structure 21 is evaporated.

The generated debris becomes an obstacle to transmission of the EUV radiation. The debris is deposited on the surface of the reflecting mirror of the exposure optical system, thereby, the reflectance of the reflecting mirror decreases. Thus, credibility and performance of the exposure apparatus is impaired by the debris.

The high voltage side electrode 11 and the ground side electrode 12 are made of tungsten therefore they are not evaporated readily, but if the temperature extremely highly increases, they are evaporated and debris is generated as well as the capillary structure 21.

SUMMARY OF THE INVENTION

It is an object of the present invention to provide an EUV radiation source capable of irradiate EUV radiation of a large power, minimizing debris.

The present invention provides an EUV radiation source comprising, a first electrode having a first through hole, a second electrode having a second through hole, a movable insulator, having a plurality of third through holes, provided between the first and second electrodes, wherein actuating gas is introduced in the first, second through holes and one of the plurality of third through holes, and voltage is impressed between the first and second electrodes when the first, second and plural through holes are located on a common axis.

The insulator may be disciform.

The insulator may be rotated with respect to a point.

The plurality of third through holes may be concentrically provided.

The EUV radiation source may include an ultraviolet laser source to generate pre-plasma.

The present invention also provides an EUV radiation source, comprising a first electrode having a first through hole, a second electrode having a plurality of second through holes, a movable insulator having a plurality of third through holes, each of which is connected to one of the plurality of second through holes, wherein the second electrode and the insulator are integrally provided, and wherein actuating gas is introduced in the first hole, one of the plurality of second through holes and one of the plurality of third through holes connected to the one of the plurality of second through holes, and voltage is impressed between the first and second electrodes when the first through hole, the one of the plurality of second through holes and the one of the plurality of third through holes are located on a common axis.

The first electrode and the insulator may define a hollow portion therein for passing through coolant.

The EUV radiation source may include an ultraviolet laser source to generate pre-plasma.

DESCRIPTION OF THE DRAWINGS

The present inventions will now be described by way of example with reference to the following figures in which.

DETAILED DESCRIPTION OF THE INVENTION

A first embodiment according to the present invention is described based on FIGS. 1 and 2 below.

Figure 1:
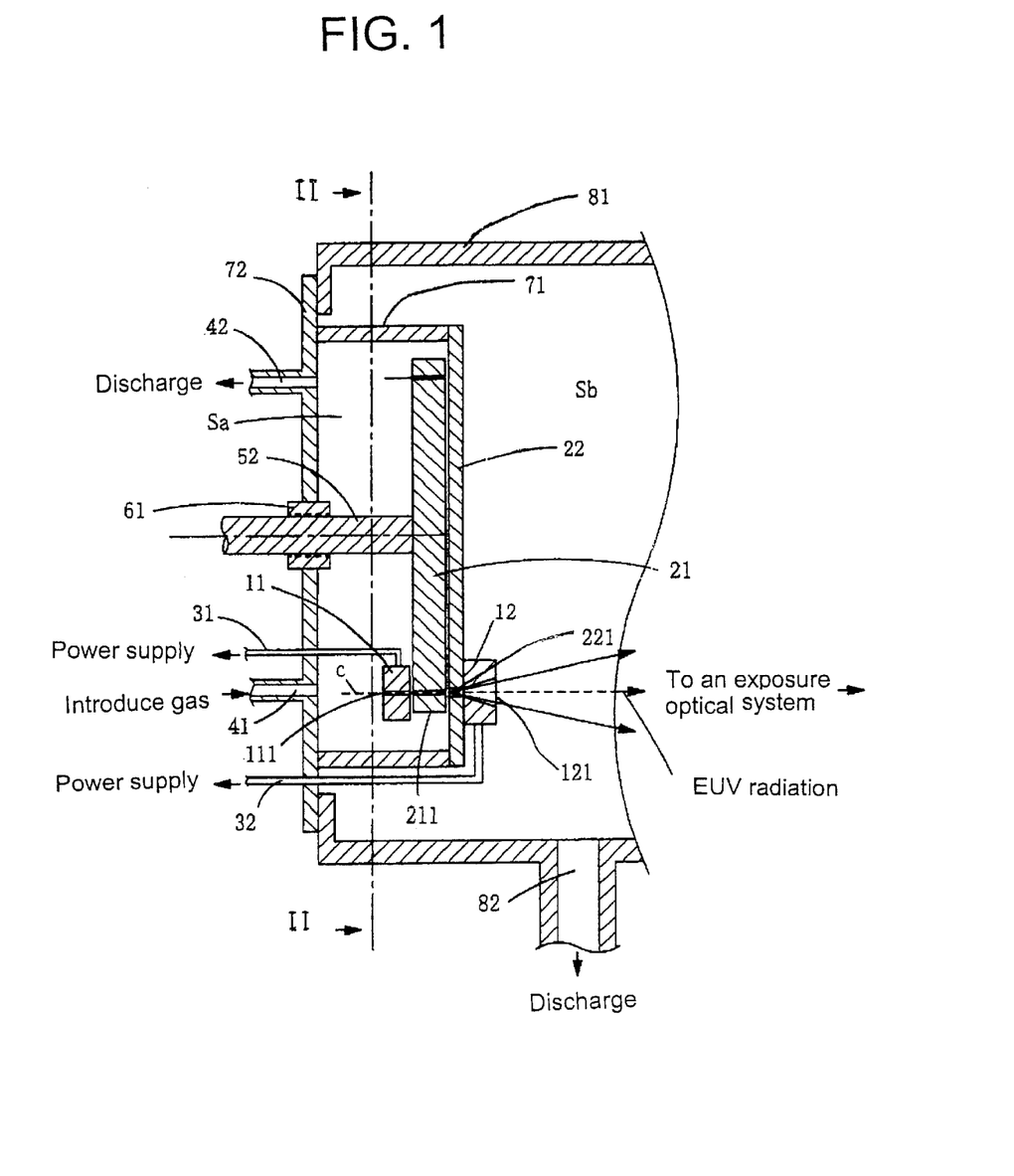
FIG. 1 is a schematic diagram of an EUV radiation source according to the first embodiment of the present invention.

FIG. 1 is a schematic diagram of an EUV radiation source according to the first embodiment of the present invention. FIG. 2 is a cross sectional view thereof taken along line II—II shown in FIG. 1

Figure 2:
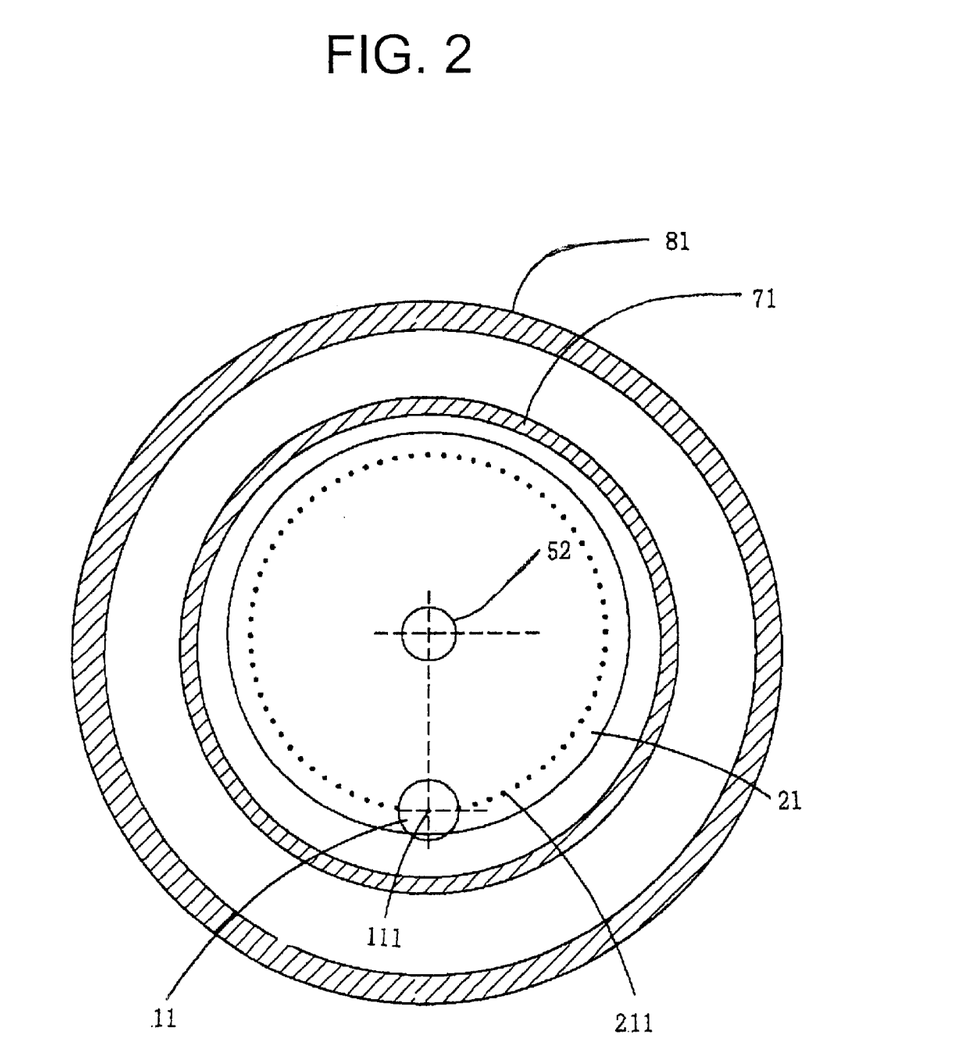
FIG. 2 is a cross sectional view thereof taken long line II—II shown in FIG. 1.

In FIGS. 1 and 2, a capillary structure 21 is an insulator. An insulated plate 22 is disposed between a high voltage side electrode 11 and a ground side electrode 12. The high voltage side electrode 11 and the ground side electrode 12 are electrically connected to a power supply (not shown) by leads 31 and 32 and a voltage pulse is impressed to the electrodes 11 and 12.

In this embodiment of the present invention, the capillary structure 21 is disciform (discoid) as shown in FIG. 2. The capillary structure 21 and a central axis 52 are integral. The central axis 52 is rotatably supported by a bearing 61.

The high voltage side electrode 11 is made of tungsten and has a disc shape and, for example, a 50 mm diameter. Further, the high voltage side electrode 11 has a 3.5 mm diameter through hole 111 in the center portion of the high voltage side electrode 11. The high voltage side electrode 11 may be made of tantalum.

The capillary structure 21 may be, for example, a 300 mm diameter disc and made of silicon nitride. Further, The capillary structure 21 has a plurality of 3 mm diameter capillaries 211 at even intervals along the circumference of the capillary structure 21. The capillary structure 21 may be made of, for example, silicon aluminum or diamond.

The ground side electrode 12 has a 60 mm diameter disc and made of tungsten. The ground side electrode 12 has a though hole 121 at the central portion of the ground side electrode 12 and has a 60 mm diameter disc. The ground side electrode 12 may be made of tantalum.

The insulated plate 22 may have, for example, a 400 mm diameter and is made of alumina etc. Further the insulated plate 22 has 4 mm diameter though holes 221.

The through hole 111 of the high voltage side electrode 11, one of the through holes 221 of the insulated plate 22 and the through hole 121 of the ground side electrode 12 are arranged so that they can be on the common axis. The common axis is hereinafter referred to as a discharge axis c.

The insulated plate 22 is fixed on a partitioning cylinder 71 which is fixed on a bottom plate 72. Thus, the bottom plate 72, the partitioning cylinder 71 and the insulated plate 22 define a space Sa.

The bottom plate 72 is air-tightly joined with an outside cylinder 81, thereby, an isolated space Sb is formed inside the outside cylinder 81. The outside cylinder 81 has an exhaust port 82. The isolated space Sb is kept in a high vacuum condition by discharging gas in the isolated space Sb at a high speed from the exhaust port 82.

After gas in the closed space Sa and the space Sb is discharged, actuating gas (such as xenon in this embodiment) necessary for discharge is introduced from a gas introducing inlet 41 into the space Sa. The gas can be discharged from a gas discharging hole 42 and pressure in the space Sa is controlled so that the pressure is appropriate for discharge (such as dozens Pa (10 s Pa)) The gas flow volume can be controlled by a well-known conventional method.

The capillary structure 21 is rotated by a motor (not show) connected to a central axis 52. In accordance with rotation of the capillary structure 21, the plurality of capillaries 211 sequentially come above the discharge axis c one by one.

When one of the capillaries 211 is located above the discharge axis c, gas discharge takes place in the one of the capillaries 211 and the through hole 221 of the insulated plate 22 by applying voltage pulse between the high voltage side electrode 11 and the ground side electrode 12, thereby, high temperature plasma is formed.

As a result, 10 to 13 nm EUV radiation is generated, as described above, and then the discharge is over.

When the next one of the capillaries is located above the discharge axis c in accordance with the rotation of the capillary structure 21, a voltage pulse is applied again to generate EUV radiation.

The generated EUV radiation passes through the through hole 121 of the ground side electrode 12 and discharged to the space Sb.

Since the actuating gas that leaks from the through hole 121 of the ground side electrode 12 to the space Sb, as described above, is discharged from the exhaust port 82 at a high speed, the isolated space Sb is kept in a high vacuum condition in which there is no obstacle to transmission of EUV radiation.

For example, when the number of capillaries 211 is 100, a rotational speed is 10 times per second, repeating frequency is 1,000 Hz, thus, 1,000 pulses are applied per second. When electric input energy per pulse is 10 J, the total power of 10 J×1,000 Hz=10,000 W is input.

In a conventional method, when such power is applied to one capillary, that is, 1,000 pulses per second are applied to the single capillary, heat load is imposed on the capillary structure 21, the high voltage side electrode 11 and the ground side electrode 12, thereby, debris is generated and further, the life span of the exposure apparatus is shortened and the credibility is impaired.

However, in the present invention, since there are one hundred capillaries 211, each one of the capillaries receives only 100 W (10 J×10 Hz=100 W), that is, 10 pulses per second are applied. Thus, in comparison to the conventional method, it is possible to reduce heat load imposed on the capillary structure 21, the high voltage side electrode 11 and the ground side electrode 12.

On the other hand, if life span credibility does not matter, in comparison to the conventional method, it is possible to increase output appearance of EUV radiation and to improve performance of the light source by increasing input energy per pulse or the repeating frequency.

As described above, according to this embodiment, it is possible for each of the plurality of capillaries to contribute to the total output light from the EUV radiation source. Therefore, heat load that one capillary receives in the conventional method, can be shared by 100 capillaries 211.

It is possible to reduce debris by controlling temperature rise of the capillary structure 21. In comparison to the conventional method, it is possible to increase output of EUV radiation. Further, it is possible to improve the life span credibility of the exposure apparatus or the EUV radiation source.

Figure 3:
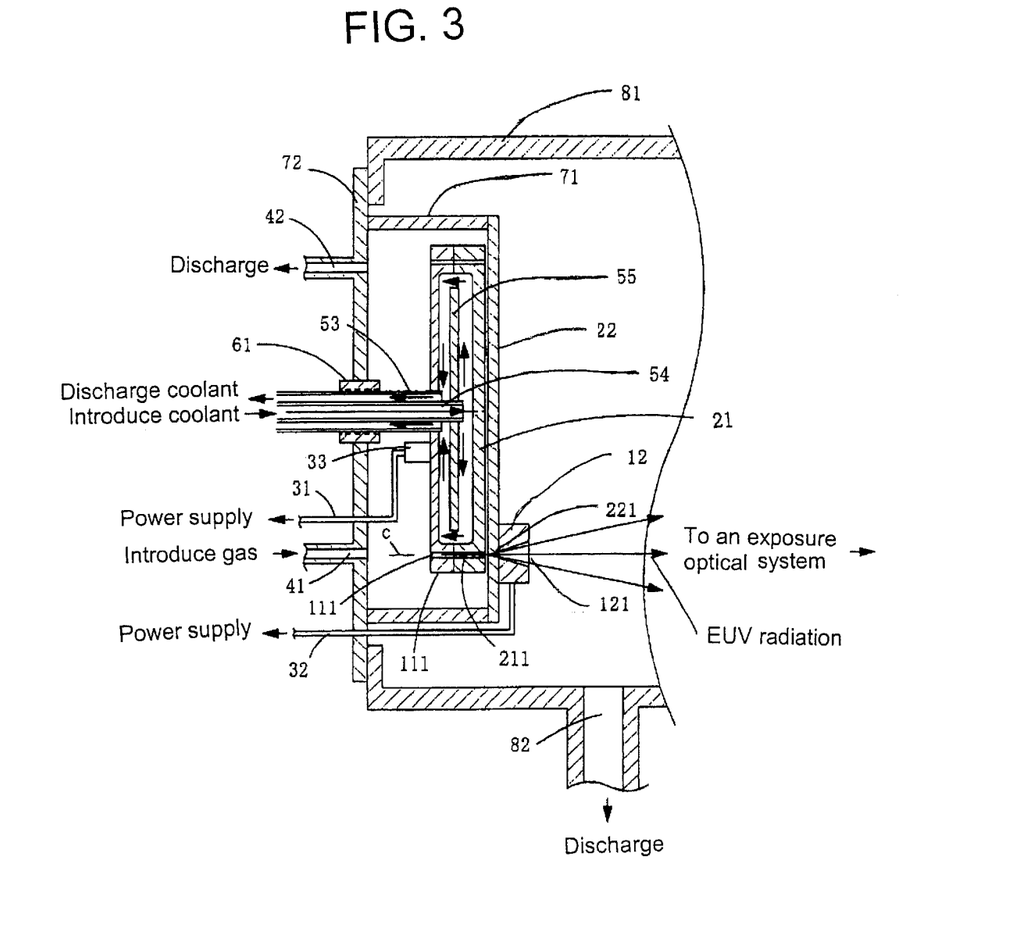
FIG. 3 is a schematic diagram of an EUV radiation source according to the second embodiment of the present invention.

FIG. 3 shows the second embodiment of the present invention and is a schematic cross sectional view of an EUV radiation source, taken along an optical axis of EUV light.

In this embodiment, a high voltage side electrode 11 and a capillary structure 21 are disciform and have approximately the same diameter. They are integrally joined.

On the high voltage electrode 11, plural through holes 111 are formed. The number of the through holes 111 is the same as that of capillaries 211. Each one of the through holes 111 and each one of the capillaries 211 make a pair and are on a common axis and are connected.

The high voltage side electrode 11 is integrally joined with a center axis 53 having a hollow portion therein. The high voltage side electrode 11 and a capillary structure 21 are rotated together by the rotation of the center axis 53. Pairs of a through hole 111 and a capillary 211 is sequentially located on the discharge axis c one by one.

A feeding brush 33 is electrically connected to a electric lead 31 and is in contact with the high voltage side electrode 11. Therefore, power can be supplied via the feeding brush 33 to the rotating high voltage side electrode 11.

A space for circulating coolant is provided it the integrally joined high voltage side electrode 11 and the capillary structure 21. The space is partitioned by a disc diaphragm 55. A coolant introducing pipe 54 and the center axis 53 form a jacketed pipe structure. The capillary structure 21 and the high voltage electrode 11 are cooled down by introducing the coolant from the coolant introducing pipe 54 and discharging the coolant through the inside of the center axis 53.

The other elements of the structure in this embodiment are the same as these shown in FIGS. 1 and 2.

The high voltage side electrode 11 and the capillary structure 21 are rotated by a motor (not shown) connected to the center axis 53.

As the high voltage side electrode 11 and the capillary structure 21 rotates, pairs of a through hole 111 and a capillary 211 passes sequentially above the discharge axis c one by one.

When one of pairs of the through hole 111 and one of the capillary 211 is located on the discharge axis c, as described above, a voltage pulse is impressed between the high voltage side electrode 11 and the ground side electrode 12. Accordingly, gas discharge takes place inside the one of the capillaries 211 and the through hole 221 of the insulator 22, and thereby high temperature plasma is formed. As a result, as described above, 10 nm to 13 nm EUV light is generated. This is one cycle of the discharge.

Further, as the high voltage side electrode 11 and the capillary structure 21 rotate, when the next capillary 211 is located on the discharge axis c, a voltage pulse is impressed again to generate EUV radiation. The generated EUV radiation is discharged to the space Sb via through hole 121 of the ground side electrode 12. This cycle is repeated.

According to this embodiment, since the capillary structure 21 and the high voltage side electrode 11 are integrally joined, and coolant is introduced therein, it is possible to effectively cool down the capillaries 21 and the high voltage side electrode 11. Accordingly, it is possible to control temperature rise of the capillary structure 21 and the high voltage side electrode 11, and to control generation of debris.

Therefore, in comparison to the first embodiment, it is possible to increase output of the EUV radiation and improve the life time credibility of the exposure apparatus and EUV radiation source.

Figure 4:
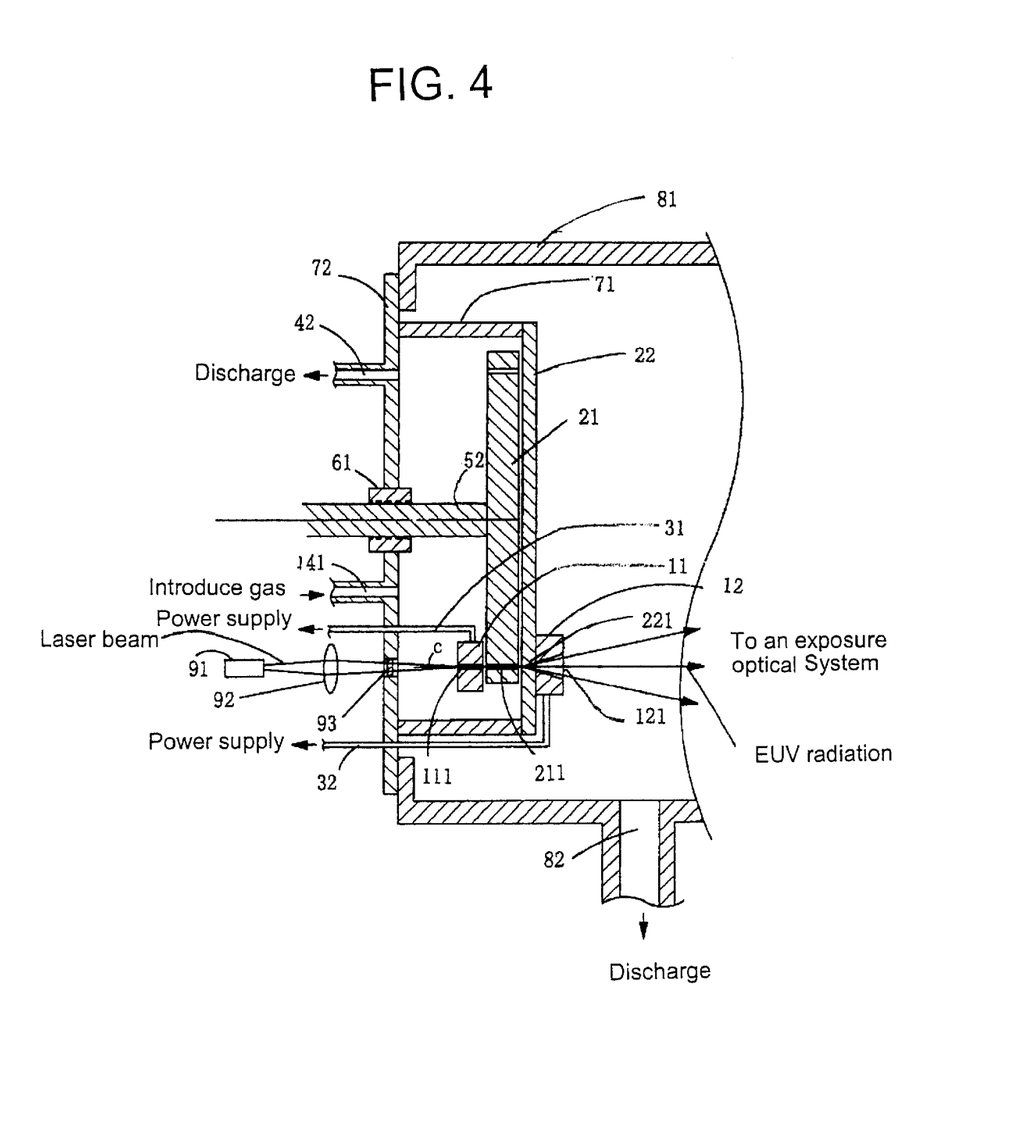
FIG. 4 is a schematic diagram of an EUV radiation source according to the third embodiment of the present invention.

FIG. 4 shows the third embodiment of the present invention and is a cross sectional view of EVU radiation source taken along an optical axis of EUV light.

In this embodiment, an ultraviolet ray laser 91 is added to an EUV radiation source shown in the first embodiment. Backup ionization for discharge is performed by using ultraviolet ray of the ultraviolet ray laser 91.

In FIG. 4, a laser beam emitted from the ultraviolet laser 91 is condensed inside a through hole 111 by a condensing lens 92 via an ultraviolet ray transmission window 93.

The other elements of the structure in this embodiment are the same as these shown in FIGS. 1 and 2.

The capillary structure 21 is rotatable. As the capillary rotates, capillaries 211 are sequentially located one by one above the discharge axis c.

When one of the capillaries is located on the discharge axis c, a laser beam is emitted from the ultraviolet laser source 91. The laser beam is condensed inside the through hole 111 and then a high voltage pulse is impressed between the high voltage side electrode 11 and the ground side electrode 12. By the laser beam, the actuating gas is ionized inside the through hole 111 of the high voltage side electrode 11 and thereby electron is generated. Thus, it is possible to certainly start discharge (dielectric breakdown).

Figure 5:
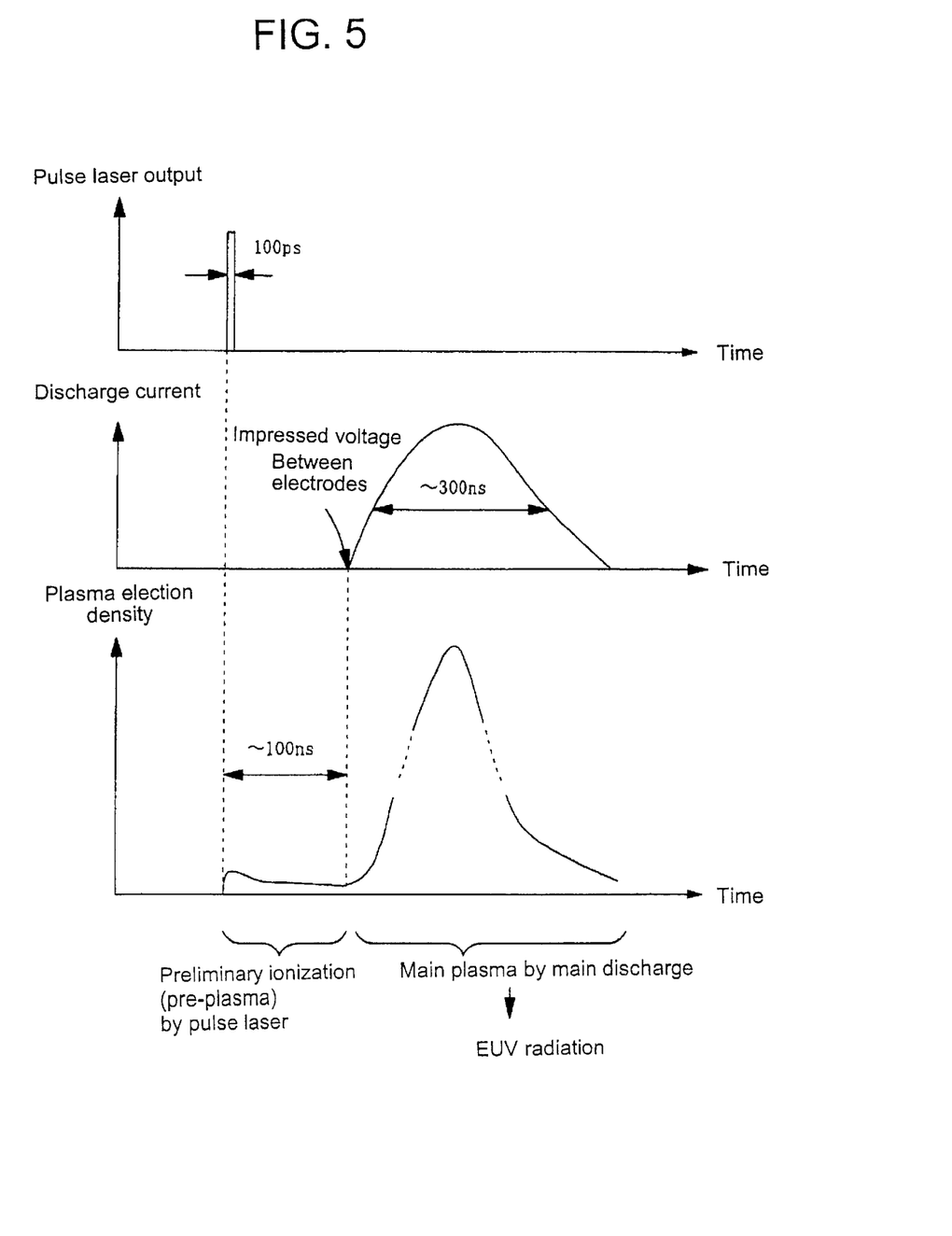
FIG. 5 is a graphs showing pulse laser output, discharge current flowing between high voltage side electrode and ground side electrode, and plasma electron density generated by discharge.

FIG. 5 shows pulse laser output of the ultraviolet laser 91, discharge current flowing between the high voltage side electrode 11 and the ground side electrode 12, and plasma electron density generated by discharge.

As shown in FIG. 5, an approximately 100 ps width laser beam is emitted from the ultraviolet laser 91, 100 ns before impression of a voltage pulse for main discharge. Thereby, in advance, pre-plasma that works as a torch for the main discharge is preliminarily generated (backup breakdown).

In this embodiment, as described above, since while pre-plasma generated by a laser beam emitted from the pulse laser 91 remains, that is, there are enough electrons necessary for next discharge, the main discharge takes place, it is certain to form discharge plasma and it is possible to eliminate misfire or delay of discharge initiation.

It is possible to certainly start discharge when one of the capillaries 211 is located on the discharge axis c even though the capillary structure 21 is rotating.

In the place where the pre-plasma is formed, the density of electron is higher than other places, therefore, it is easy to form high electron density plasma when the main discharge takes place. Further, if the pulse laser emitting condition is fixed, a position where the pre-plasma is formed is fixed and the plasma shape for the main discharge is stabilized. As a result, it is possible to stabilize output of the EUV radiation.

Although, in the third embodiment, the ultraviolet laser 91 is added to the EUV radiation source in the first embodiment, it is possible to add the ultraviolet laser source 91 to the EUV radiation source in the second embodiment. While as described above, pre-plasma is generated by the ultraviolet laser 91, and the pre-plasma does not disappear, it is possible to start main discharge by impressing a high voltage pulse to the high voltage side electrode 11 and the ground side electrode 12.

In the second embodiment, plural through holes and capillaries are provided in the disc shaped high voltage side electrode 11 and the capillary structure 21 and the high voltage side electrode 11 and the capillary structure 21 are integrally joined, and further, coolant is introduced inside the high voltage side electrode 11 to cool down the high voltage electrode 11 and the capillary structure 12, and further more the high voltage side electrode 11 and the capillary structure 21 are rotated together.

However, in the second embodiment, the ground side electrode 12 may be disciform. The disc electrode 12 may have plural through holes and it may be rotated together with the high voltage side electrode 11 and capillary structure 21. Therefore, it is possible to reduce heat load of the ground side electrode 12.

As described above, according to the present invention, since the insulator having a plurality of through holes is at least movable, and voltage pulse is impressed between the first and second electrodes when the first and second electrodes and the plurality of through holes are on a common axis, it is possible to reduce heat load which is received per one through hole of the insulator and further, it is possible to reduce temperature rise of the insulator and generation of debris. Therefore, it is possible to improve the life span credibility of the exposure apparatus or EUV radiation source.

Further, if the life span credibility does not matter, it is possible to increase input energy per one pulse or increase repeating frequency, thereby it is possible to increase apparent output of the EUV radiation source.

Furthermore, according to the present invention, since the insulator may be disciform, the plurality of through holes may be concentrically provided with respect to a point and the disc insulator may be rotated with respect to the point, it is possible to rotate the insulator using relatively simple mechanism.

Still further, according to the present invention, since the first electrode and the insulator having a space therein for passing through coolant to cool down the first electrode and the insulator, are integrally joined, it is possible to reduce temperature rise of the insulator and generation of debris by cooling the first electrode and the insulator by coolant flowing inside the integrated insulator and the first electrode.

Therefore, it is possible to improve life span credibility of exposure apparatus or EUV radiation source.

The disclosure of Japanese Patent Application No. 2002-087925 filed on Mar. 27, 2002 including specification, drawings and claims is incorporated herein by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. An EUV radiation source, comprising:
    a first electrode having a first through hole;
    a second electrode having a second through hole;
    a movable insulator, having a plurality of third through holes, provided between the first and second electrodes,
    wherein actuating gas is introduced in the first, second through holes and one of the plurality of third through holes, and voltage is impressed between the first and second electrodes when the first, second and plural through holes are located on a common axis.

2. The EUV radiation source according to claim 1, wherein the insulator is disciform.

3. The EUV radiation source according to claim 2, wherein the insulator is rotated with respect to a point.

4. The EUV radiation source according to claim 2, wherein the plurality of third through holes are concentrically provided.

5. The EUV radiation source according to claim 1, further including an ultraviolet laser to generate pre-plasma.

6. An EUV radiation source, comprising:

a first electrode having a first through hole;

a second electrode having a plurality of second through holes;

a movable insulator having a plurality of third through holes, each of which is connected to one of the plurality of second through holes, wherein the second electrode and the insulator are integrally provided, and wherein actuating gas is introduced in the first hole, one of the plurality of second through holes and one of the plurality of third through holes connected to the one of the plurality of second through holes, and voltage is impressed between the first and second electrodes when the first through hole, the one of the plurality of second through holes and the one of the plurality of third through holes are located on a common axis.

7. The EUV radiation source according to claim 6, wherein the insulator is disciform.

8. The EUV radiation source according to claim 6, wherein the insulator is rotated with respect to a point.

9. The EUV radiation source according to claim 6, wherein the plurality of third through holes are concentrically provided.

10. The EUV radiation source according to claim 6, wherein the first electrode and the insulator form hollow portion therein for passing through coolant.

11. The EUV radiation source according to claim 6, further including an ultraviolet laser to generate pre-plasma.

* * * * *